(12) United States Patent
Emura

(10) Patent No.: US 9,472,724 B2
(45) Date of Patent: Oct. 18, 2016

(54) SEMICONDUCTOR LIGHT EMITTING ELEMENT

(71) Applicant: NICHIA CORPORATION, Anan-shi, Tokushima (JP)

(72) Inventor: Keiji Emura, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/617,545

(22) Filed: Feb. 9, 2015

(65) Prior Publication Data
US 2015/0236207 A1 Aug. 20, 2015

(30) Foreign Application Priority Data
Feb. 17, 2014 (JP) .................................. 2014-027331

(51) Int. Cl.
*H01L 33/38* (2010.01)
*H01L 23/00* (2006.01)

(52) U.S. Cl.
CPC .............. *H01L 33/38* (2013.01); *H01L 24/00* (2013.01); *H01L 2924/12036* (2013.01); *H01L 2924/12042* (2013.01)

(58) Field of Classification Search
CPC ....... H01L 33/36; H01L 33/38; H01L 24/00; H01L 2924/12036; H01L 2924/12041; H01L 2924/12042; H01L 2924/12044
See application file for complete search history.

(56) References Cited

U.S. PATENT DOCUMENTS

| | | | |
|---|---|---|---|
| 6,307,218 B1 | 10/2001 | Steigerwald et al. | |
| 2010/0012971 A1 | 1/2010 | Hiraoka et al. | |
| 2010/0155752 A1 | 6/2010 | Lim et al. | |
| 2011/0163346 A1* | 7/2011 | Seo | H01L 33/08 257/99 |
| 2012/0171796 A1 | 7/2012 | Hiraoka et al. | |
| 2013/0009197 A1 | 1/2013 | Seo et al. | |
| 2013/0221399 A1 | 8/2013 | Seo et al. | |
| 2014/0077252 A1 | 3/2014 | Lim et al. | |
| 2014/0209962 A1 | 7/2014 | Seo et al. | |
| 2014/0209966 A1 | 7/2014 | Seo et al. | |
| 2014/0231859 A1* | 8/2014 | Kim | H01L 33/38 257/99 |

FOREIGN PATENT DOCUMENTS

| | | |
|---|---|---|
| JP | 2000-164930 A | 6/2000 |
| JP | 2008-226866 A | 9/2008 |
| JP | 2008-244425 A | 10/2008 |
| JP | 2010-153870 A | 7/2010 |
| JP | 2011-142324 A | 7/2011 |

* cited by examiner

*Primary Examiner* — Armando Rodriguez
(74) *Attorney, Agent, or Firm* — Global IP Counselors, LLP

(57) ABSTRACT

The present disclosure relates to a semiconductor light emitting element. The semiconductor light emitting element has a first conductivity type layer, a light emitting layer, and a second conductivity type layer that are laminated; a first pad electrode provided to the first conductivity type layer; and second pad electrodes provided to the second conductivity type layer. The first pad electrode and the second pad electrode is disposed on the same side of the semiconductor light emitting element. Plan view shape of the semiconductor light emitting element is rectangular. The first pad electrode is disposed in a middle region of three regions of the semiconductor light emitting element. The three regions are defined by dividing the light emitting element into three equal parts in the lengthwise direction of the semiconductor light emitting element. The second pad electrodes are respectively disposed in regions on both sides of the three regions.

15 Claims, 11 Drawing Sheets

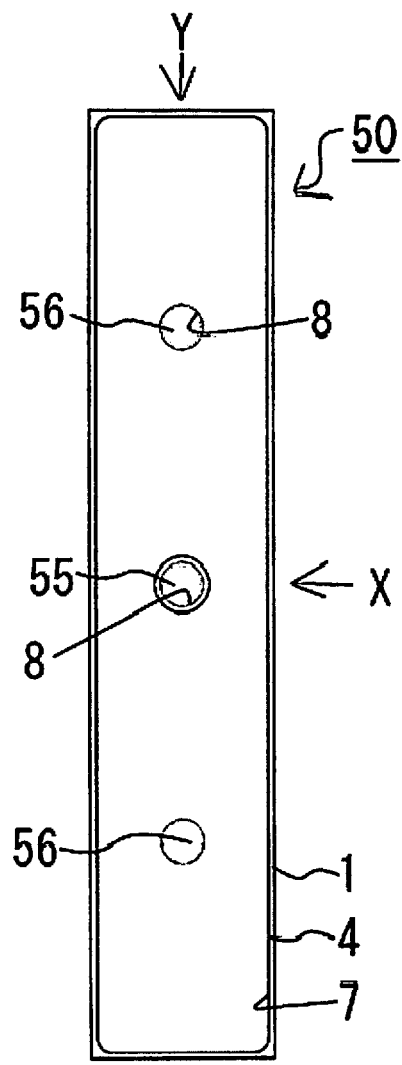
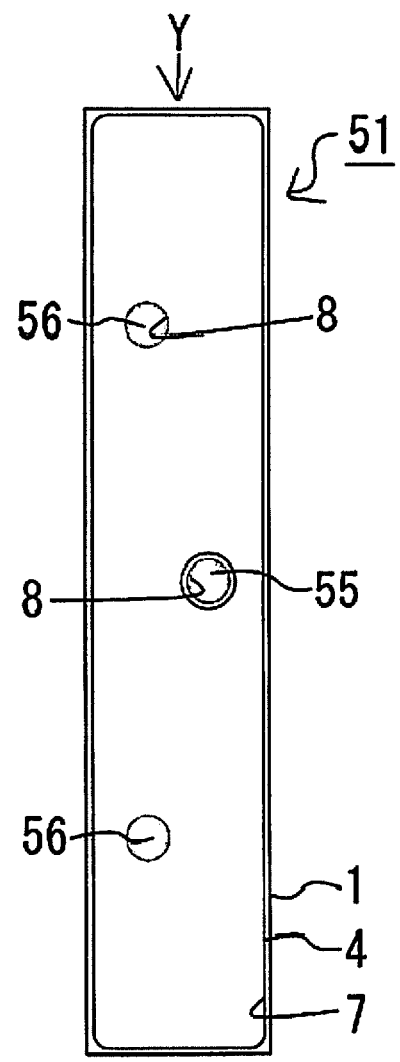
FIG. 5A
FIG. 5B

FIG. 6A
FIG. 6B
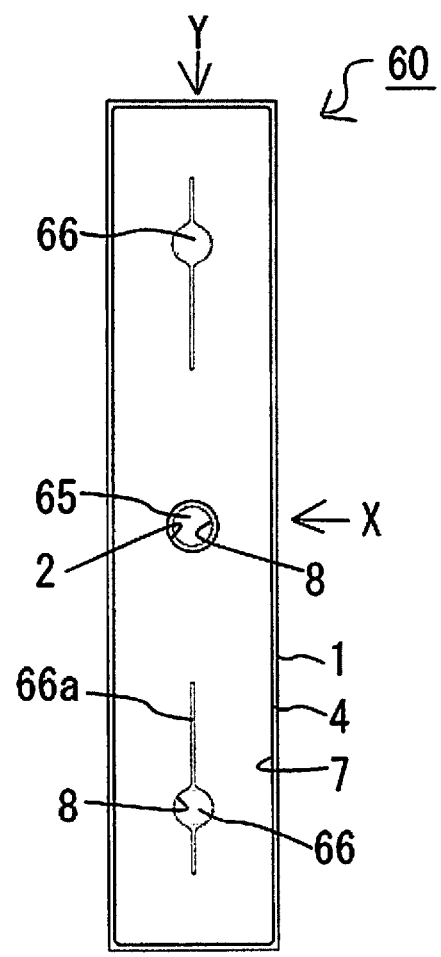
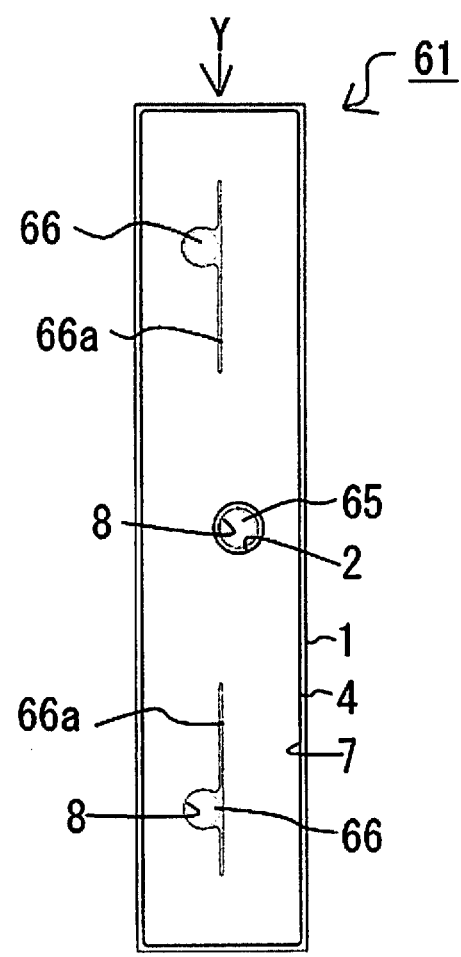

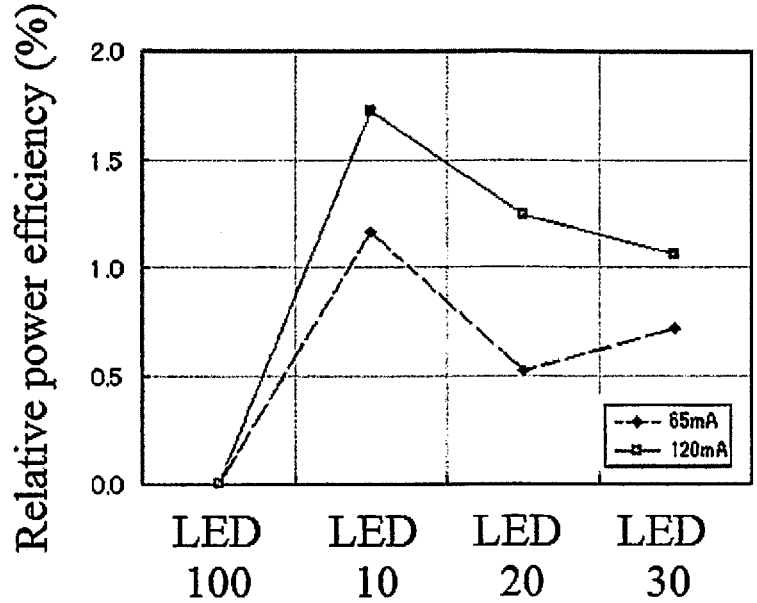

SEMICONDUCTOR LIGHT EMITTING ELEMENT

CROSS-REFERENCE TO RELATED APPLICATIONS

This application claims priority to Japanese Patent Application No. 2014-027331 filed on Feb. 17, 2014. The entire disclosure of Japanese Patent Application No. 2014-027331 is hereby incorporated herein by reference.

BACKGROUND

1. Technical Field

The present disclosure relates to a semiconductor light emitting element.

2. Related Art

Nitride semiconductor light emitting elements have been widely used in recent years. In this type of semiconductor light emitting element, n-type and p-type nitride semiconductor layers are laminated over a sapphire substrate which is an insulating substrate, part of the p-type nitride semiconductor layer is removed to expose the n-type nitride semiconductor layer, an n electrode is formed on the exposed portion of the n-type nitride semiconductor layer, and a p electrode is formed over substantially the entire surface of the remaining p-type nitride semiconductor layer.

In a nitride semiconductor light emitting element in which n and p electrodes are formed on the same side of a substrate, which is the light extraction side, in order for the light to be emitted uniformly from the semiconductor layer side, a transparent p ohmic electrode is formed over substantially the entire surface of the p-type nitride semiconductor layer, and a pad electrode and extending electrodes having various shapes and extending from the pad electrode are formed over the p ohmic electrode, so that the extending electrodes diffuse the current uniformly to the p-type nitride semiconductor layer, which has relatively high resistance (JP2008-226866A, JP2008-244425A).

However, given today's need for nitride semiconductor light emitting elements that are larger, output more light, etc., it has been difficult to apply current uniformly over the entire light emitting face (that is, the p-type semiconductor layer in plan view), and to ensure uniform light emission.

SUMMARY

The present disclosure provide a semiconductor light emitting element with which light can be uniformly emitted over the entire light emitting face, even with a semiconductor light emitting element that is larger and/or outputs more light.

The embodiments of the present invention relate to a semiconductor light emitting element. The semiconductor light emitting element has a first conductivity type layer, a light emitting layer, and a second conductivity type layer that are laminated; a first pad electrode provided to the first conductivity type layer; and second pad electrodes provided to the second conductivity type layer. The first pad electrode and the second pad electrode are disposed on the same side of the semiconductor light emitting element. Plan view shape of the semiconductor light emitting element is rectangular. The first pad electrode is disposed in a middle region of three regions of the semiconductor light emitting element in plan view. The three regions are defined by dividing the light emitting element into three equal parts in a lengthwise direction of the semiconductor light emitting element. The second pad electrodes are respectively disposed in regions on both sides of the three regions.

According to embodiments of the present invention, it is possible for a semiconductor light emitting element with larger size and/or high light output to emit light uniformly over the entire light emitting face.

BRIEF DESCRIPTION OF DRAWINGS

FIGS. 5A and 5B are simplified plan views of modification examples of an embodiment 5 of the present invention;

FIGS. 6A and 6B are simplified plan views of modification examples of an embodiment 6 of the present invention;

FIG. 10C is a graph of a power efficiency of a semiconductor light emitting element pertaining to an embodiment of the present invention.

DETAILED DESCRIPTION OF THE EMBODIMENTS

Figure 1A:
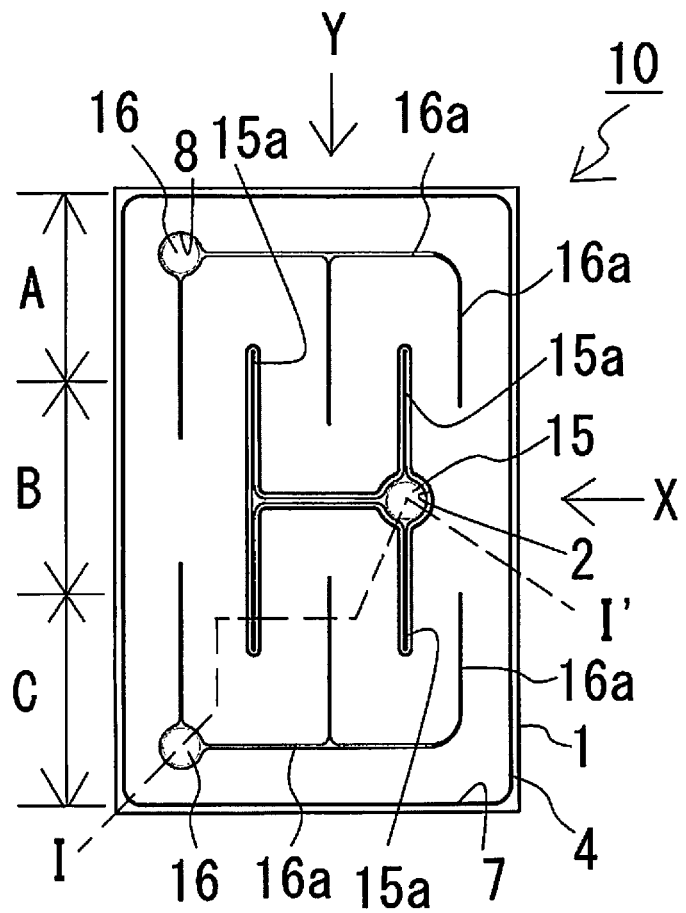
FIG. 1A is a simplified plan view of a layout of electrodes in a semiconductor light emitting element pertaining to an embodiment 1 of the present invention.

Embodiments for implementing the semiconductor light emitting element of the present invention will be described below with reference to the accompanying drawings. The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted. In addition, a plurality of structural elements of the present disclosure may be configured as a single part which serves the purpose of a plurality of elements, on the other hand, a single structural element may be configured as a plurality of parts which serve the purpose of a single element. Further, constitutions described in some of examples and embodiments can be employed in other examples and embodiments.

<Semiconductor Light Emitting Element>

The semiconductor light emitting element pertaining to embodiments of the present invention (hereinafter referred to simply as a light emitting element) mainly has a first conductivity type layer, a light emitting layer, and a second conductivity type layer that are laminated, and a first pad electrode that is provided to the first conductivity type layer, and a second pad electrode that is provided to the second conductivity type layer. The plan view shape of the semiconductor light emitting element is rectangular. From the standpoint of machining precision, however, the four corners may be rounded and may be about 90±5 degrees in angle.

The light emitting element pertaining to the embodiments allows high light output, particularly when the surface area of the light emitting face is increased. For instance, it is effective when the size of the light emitting face is at least 0.4 mm$^2$, and even more effective when the size is at least 0.45 mm$^2$.

(First Conductivity Type Layer, Light Emitting Layer, and Second Conductivity Type Layer)

The first conductivity type layer, the light emitting layer, and the second conductivity type layer are constituted by semiconductor layers, and are members that serve as a light emitting part in a semiconductor light emitting element. MIS, PIN or PN junction or other such homo-junction, hetero junction, or double hetero junction may be used. The light emitting layer may have either a multiple quantum well structure or a single quantum well structure formed as a thin film that produces a quantum effect. The first conductivity type layer, the light emitting layer, and the second conductivity type layer are preferably laminated in that order. When the first conductivity type layer is n-type, then the second conductivity type layer is p-type, and vice versa. There are no particular restrictions on the type or material of the semiconductor layer, but $In_XAl_YGa_{1-X-Y}N$ (0≤X, 0≤Y, X+Y≤1) or another such nitride semiconductor material can be used preferably.

The first conductivity type layer, the light emitting layer, and the second conductivity type layer are usually laminated on a substrate. Examples of substrate materials include insulating substrates such as sapphire ($Al_2O_3$) or spinel ($MgAl_2O_4$), oxide substrates such as neodymium gallate or lithium niobate lattice-matching to a nitride semiconductor, and silicon carbide (SiC), ZnS, ZnO, silicon, GaAs, and diamond. The substrate may ultimately be removed from the semiconductor light emitting element. Any known laser liftoff method can be used to remove the substrate.

The light emitting element has a region in which at least the light emitting layer and the second conductivity type layer are removed from part of the region where the first conductivity type layer, the light emitting layer, and the second conductivity type layer are laminated, thereby exposing the first conductivity type layer (hereinafter referred to as the exposed region). A first pad electrode discussed below is provided on the exposed region of the first conductivity type layer. In plan view, the exposed region may be an outer peripheral region of the light emitting element, or a region on an inside of the light emitting element, or the region from the inside to the outer periphery.

(First Pad Electrode and Second Pad Electrode)

The first pad electrode and the second pad electrode are used to be connected to, for example, an electrically-conducting wire or other such external connection member in order to supply current to the light emitting element.

The first pad electrode and the second pad electrode are provided on the same side, which is the side with the light extraction face of the light emitting element. One light emitting element preferably has one first pad electrode and two second pad electrodes. Thus providing a plurality of pad electrodes allows current to flow separately in the external connection member, which has lower electrical resistance than the pad electrodes, and this improves the power efficiency of the light emitting element.

For example, it is preferable that the first pad electrode and the second pad electrodes are respectively provided to three regions defined by dividing the light emitting element into three equal parts in the lengthwise direction in plan view. Of these three regions, the first pad electrode is preferably disposed in the middle region, and the second pad electrodes are respectively disposed in the regions on both sides. This allows the distance between the first pad electrode and the second pad electrodes to be set short in the lengthwise direction of the light emitting element, so the drive voltage of the light emitting element can be reduced, and it is easier to ensure uniform emission over the entire light emitting face. Here, the second pad electrodes may be linked together by second extending electrodes discussed below, but the second extending electrodes are preferably disposed separately from one another. When they are separated, the second extending electrodes are preferably away from one another at the middle region. This moderates the concentration of current near the first pad electrode. "dispose separately" means that even in the case where second extending electrodes discussed below extend from the second pad electrodes, the second extending electrodes extending from the regions on the both sides are not linked together, and are disposed apart.

The first pad electrode is preferably disposed on a center line extending in the short-side direction of the light emitting element (see X in FIG. 1A). The second pad electrodes are preferably disposed in symmetry to the center line X extending in the short-side direction of the light emitting element. The first pad electrode is more preferably disposed on a different side from the second pad electrodes with respect to the center line extending in the lengthwise direction of the light emitting element (see Y in FIG. 1A). This allows the current to spread out also in the short-side direction of the light emitting element. Also, the first pad electrode and the second pad electrodes are each eccentrically-located on a side of the long side of the light emitting element, so that there will be a smaller region where the top of the light emitting element is covered by the electrically-conducting wires and light is blocked when the first pad electrode and the second pad electrodes are connected by electrically-conducting wires.

The first pad electrode is electrically connected either directly or indirectly to the first conductivity type layer in order to supply current to the first conductivity type layer.

The second pad electrodes are electrically connected either directly or indirectly to the second conductivity type layer in order to supply current to the second conductivity type layer.

The shape of the first pad electrode and the second pad electrodes can be suitably adjusted according to the size of the light emitting element, the layout of the electrodes, and so forth, and can be, for example, circular, regular polygonal, or another such shape. Of these, a shape that is circular or close to circular is preferable when ease of wire bonding is taken into account. Also, the size of the first pad electrode and the second pad electrodes can be suitably adjusted according the size of the light emitting element, the layout of the electrodes, and so forth, but the maximum length thereof is preferably about 5 to 30% of the length of the short side of the light emitting element, more preferably about 5 to 20%, and even more preferably about 10 to 20%. The shape and size of the first pad electrode and the second pad electrodes may be mutually different, but are preferably the same.

There has been a need in recent years for nitride semiconductor light emitting elements to be larger, output more light, and so on. However, when the current is merely diffused at the extending electrodes as with a conventional nitride semiconductor light emitting element in order to apply a large current uniformly over the entire light emitting face (that is, the p-type semiconductor layer in plan view) and ensure uniform light emission, then there will be a major increase in the surface area of the extending electrodes, particularly when the light emitting face has a larger surface area due to an increase in the size of the nitride semiconductor light emitting element. As a result, this may lead to a decrease in light output. In contrast, disposing the first pad electrode or the second pad electrode in each region obtained by dividing the light emitting element into three equal parts, as discussed above, and disposing extending electrodes at suitable portions, as discussed below, allow to ensure uniform emission over the entire light emitting face even in the case where the light emitting face has a larger surface area without decrease in light output.

The first pad electrode can have first extending electrodes that extend from the first pad electrode. The first extending electrodes preferably extend from the middle region to the regions on both sides of three regions defined by dividing the semiconductor light emitting element into three equal parts in the lengthwise direction, for example. The distal ends of the first extending electrodes are preferably disposed in the regions on both sides of three regions defined by dividing the semiconductor light emitting element into three equal parts in the lengthwise direction. In this case, the distal ends are preferably opposite the second extending electrodes discussed below. The first extending electrodes may extend so as to flank the distal ends of the second extending electrodes, that is, the two first extending electrodes extend on two sides of the distal ends of the second extending electrodes, for example.

The second pad electrode can have second extending electrodes that extend from the second pad electrodes. The second extending electrodes preferably extend so as to flank the distal ends of the first extending electrodes, for example. Also, the second extending electrodes are preferably disposed more to the outside in the lengthwise direction than the first extending electrodes. Furthermore, the second pad electrodes are preferably disposed more to the outside in the lengthwise direction than the first extending electrodes. The phrase "disposed more to the outside" here means that the ends of the second pad electrodes or second extending electrodes disposed closest to the outside are disposed more to the outside than the ends of the first pad electrode and first extending electrodes disposed closest to the outside. Furthermore, the second extending electrodes preferably extend both in the lengthwise direction and the short-side direction, and may extend in a direction that is a composite of the lengthwise direction and the short-side direction (that is, obliquely).

The first extending electrodes and the second extending electrodes may be disposed in a shape that is linear or in which a straight line is bent, or may extend in a curve. In particular, when the first extending electrodes and the second extending electrodes are disposed in a region corresponding to a corner of the light emitting element, they may be bent in a rounded shape. The first extending electrodes and second extending electrodes preferably have parts that are disposed parallel to each other so that current can be uniformly diffused. Also, the first extending electrodes and second extending electrodes may branch into two or more parts.

There are no particular restrictions on the line width of the first extending electrodes and the second extending electrodes, but a line width is preferably about 5 to 30% of the diameter or maximum length of the first pad electrode and second pad electrodes, more preferably about 5 to 20% of that, and even more preferably about 5 to 15% of that. The line width of the first extending electrodes may differ from that of the second extending electrodes, but the line width is preferably designed taking into account the maximum current density within the first extending electrodes and the second extending electrodes.

A light-transmissive electrically-conducting layer that covers substantially the entire surface of the semiconductor layer is preferably further disposed between the first pad electrode and the semiconductor layers and/or between the second pad electrodes and the semiconductor layers in order to supply current more efficiently to the entire surface of these pad electrodes. It is particularly preferable for the light-transmissive electrically-conducting layer to be disposed between the p-type semiconductor layer and the pad electrodes provided thereon. The term "substantially the entire surface" here means about 90% or more of the entire surface area of the respective semiconductor layers.

The first pad electrode and the second pad electrodes can be, for example, a single-layer film or multilayer film made of Ni, Rh, Cr, Au, W, Pt, Ti, Al, etc., or alloy of these materials, and it is particularly favorable to use a multilayer film in which Ti/Pt/Au, Ti/Rh/Au, or the like laminated in that order.

When the first pad electrode and second pad electrodes are disposed as discussed above, even if the surface area of the light emitting face is increased, and even if a large amount of current is applied, blocking of the light emitted from the light emitting face by the electrodes can be kept to a minimum, while the drive (forward) voltage (Vf) can be kept low. As a result, which affords a semiconductor light emitting element that has high light output, has low drive (forward) voltage (Vf), and has good power efficiency.

(Electrically-Conducting Layer)

The electrically-conducting layer is a member that allows the current supplied from the pad electrodes to flow uniformly to the entire surface of the semiconductor layers. A metal thin-film can also be used as the electrically-conducting layer, but an electrically-conducting layer that has transparent property is preferable because it is disposed on the light extraction side of the light emitting element. More specifically, an electrically-conducting oxide layer is preferable. Examples of the electrically-conducting oxide include an oxide containing at least one element selected from among zinc, indium, tin, and magnesium such as ZnO, $In_2O_3$, $SnO_2$, ITO (Indium Tin Oxide), IZO (Indium Zinc Oxide), GZO (Gallium-doped Zinc Oxide). The electrically-conducting oxide (particularly Indium Tin Oxide: ITO) can be preferably used because it has high optical transmissivity (such as 60% or higher, 70% or higher, 75% or higher, or 80% or higher) of visible light (in the visible band), and is a material with relatively high electrical conductivity.

<Light Emitting Device>

The light emitting element of each embodiment is usually packaged in a light emitting device. In the light emitting device, the light emitting element is mounted on a substrate and sealed with a sealing member.

The substrate is usually formed of wiring pattern and an insulating material. The wiring pattern is used to supply electrical power to the electrodes of the light emitting element. Accordingly, there are no restrictions on the material, as long as it is a conductor capable of serving this function. Such material can be suitably selected from among those used in the above-mentioned first pad electrode, etc.

Examples of insulating materials include ceramics, resins, dielectrics, pulp, glass, composites of these materials, and composite materials of these materials and an electrically-conducting material such as a metal or carbon.

When integrated, the wiring and the insulating material may be cubic, cuboid, or the like in shape, and they may have a recess portion on which the light emitting element is to be mounted.

The sealing member is used to protect the light emitting element and the external connection members or the like such as the electrically-conducting wires from the outside, and can be made of any material as long as it allows light to be efficiently extracted from the light emitting element. For instance, a light-transmissive resin can be used.

The light-transmissive resin is preferably one that will transmit at least 60% of the light emitted from the light emitting layer, and more preferably at least 70%, 80%, or 90%. Examples of such a resin include a silicone resin composition, a modified silicone resin composition, an epoxy resin composition, a modified epoxy resin composition, an acrylic resin composition, a silicone resin, an epoxy resin, an urea resin, fluorine resin or hybrid resin containing one or more of these resins. The sealing member may contain a light scattering material, an inorganic filler, or any other such material known in this field.

A phosphor layer is preferably provided on the light extraction side of the light emitting device. The phosphor layer may be the sealing member in which a phosphor is contained therein. Also, the phosphor may be contained in a portion of a surface of the sealing member.

The phosphor contained in the phosphor layer can be any one that is known in this field. For instance, when a gallium nitride light emitting element that emits blue light is used as the light emitting element, examples of the phosphor include YAG and LAG phosphors that absorb blue light and emit yellow to green light, SiAlON (β SiAlON) phosphors that emit green light, SCASN and CASN phosphors that emit red light, and fluoride phosphors (such as $K_2SiF_6$ or $K_2Si_{0.5}Ge_{0.5}F_6$ activated with $Mn^{4+}$), which can be used individually or in combinations. Any light scattering materials, fillers, additives or the like known in this field may also be contained.

Also, a sealing member made of the above-mentioned light-transmissive resin and containing no phosphor may be disposed.

The phosphor layer and/or sealing member may also be ones in which two or more kinds of materials are laminated.

The specific embodiments of the light emitting element are described through reference to the drawings.

Embodiment 1

Figure 1B:
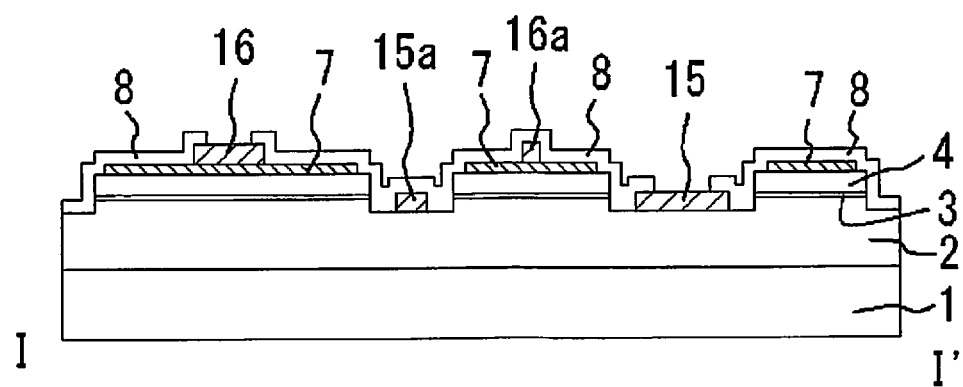
FIG. 1B is a cross section along the I-I' line in FIG. 1A.

As shown in FIGS. 1A and 1B, the semiconductor light emitting element 10 in Embodiment 1 has a substrate 1 and a semiconductor layer in which a first conductivity type layer (n-type layer) 2, a light emitting layer 3, and a second conductivity type layer (p-type layer) 4 are provided on the substrate 1. A first pad electrode 15 and second pad electrodes 16 are respectively provided to the first conductivity type layer 2 and the second conductivity type layer 4.

The substrate 1 and the semiconductor layer (particularly the p-type layer) are substantially rectangular in plan view, and the semiconductor layer measures approximately 1000× 700 μm.

When the semiconductor light emitting element 10 is divided into three equal regions in the lengthwise direction of the rectangular shape, the first pad electrode 15 is disposed in a region B in the middle. The second pad electrodes 16 are respectively disposed apart from each other in regions A and C on both sides of the semiconductor light emitting element 10.

Part of the second conductivity type layer 4 and the light emitting layer 3 is removed to expose the first conductivity type layer 2 on the inside of the semiconductor layer in plan view, and the first pad electrode 15 is disposed on the exposed first conductivity type layer 2. Therefore, the first pad electrode 15 is surrounded by the second conductivity type layer 4 and the light emitting layer 3. The first pad electrode 15 and the second pad electrodes 16 are provided on the same side with respect to the substrate 1 and/or the semiconductor layer.

The second pad electrodes 16 is formed on the second conductivity type layer 4. ITO is disposed as a light-transmissive electrically-conducting layer 7 over substantially the entire face of the second conductivity type layer 4, between the second pad electrodes 16 and the second conductivity type layer 4.

The semiconductor layer, the first pad electrode 15, and the second pad electrodes 16 are covered by a protective film 8, except in the region where a connection is made with the external connection member.

The first pad electrode 15 is disposed on the center line X (the line indicated by the arrow X in FIG. 1A) that extends in the short-side direction of the semiconductor light emitting element 10. The first pad electrode 15 is disposed on a side different from the side of the second pad electrodes 16 with respect to the center line Y that extends in the lengthwise direction of the semiconductor light emitting element 10. The second pad electrodes 16 are disposed in symmetry with respect to the center line X. The first pad electrode 15 and the second pad electrodes 16 are substantially circular in shape, with a radius of about 30 μm, for example.

The first pad electrode 15 has first extending electrodes 15a that extend from the first pad electrode 15, and the second pad electrodes 16 have second extending electrodes 16a that extends from the second pad electrodes 16. The first extending electrodes 15a extend from the middle region B to the regions A and C on both sides, and have distal ends that are opposite the second extending electrodes 16a in the regions A and C on both sides. The second extending electrodes 16a extend in the lengthwise direction and in the short-side direction from the second pad electrodes 16 disposed in the regions A and C on both sides, and are disposed so as to flank the distal ends of the first extending electrodes 15a in the short-side direction. The second pad electrodes 16 are disposed more to the outside in the lengthwise direction than the distal ends of the first extending electrodes 15a, and the second extending electrodes 16a are disposed more to the outside in the lengthwise direction than the first extending electrodes 15a. The line width of the first extending electrodes 15a and the second extending electrodes 16a is about 6 μm, for example.

The first extending electrodes 15a are disposed in a region whose center is the first pad electrode 15 and whose length is approximately 50% of the length of the semiconductor light emitting element 10 in the lengthwise direction. It is also disposed in a region whose center is the first pad electrode 15 and whose length is approximately 50% of the length of the semiconductor light emitting element 10 in the short-side direction. The second extending electrodes 16a are disposed in regions having a length of approximately one-third the length of the semiconductor light emitting element 10 in the lengthwise direction, from the second pad electrodes 16. The second extending electrodes 16a are also disposed in regions having a length of approximately 75% of the length of the semiconductor light emitting element 10 in the short-side direction, from the second pad electrodes 16.

In the middle region of semiconductor light emitting element 10, the first extending electrodes 15a are formed in an H shape or in the form of a shape that two U shapes are linked. The second extending electrodes 16a are formed in an E shape at the two sides in the lengthwise direction. The distal ends of the first extending electrodes 15a are flanked by the second extending electrodes 16a, and one of the distal ends of the second extending electrodes 16a is flanked by the first extending electrodes 15a. In other words, in the short-side direction of the semiconductor light emitting element 10, particularly in the regions A and C on the both side, the first extending electrodes 15a and the second extending electrodes 16a are alternately disposed and equidistantly spaced apart.

Modification Example of Embodiment 1

In the semiconductor light emitting element according to the modification example of embodiment 1, the pattern of the pad electrodes of the semiconductor light emitting element 10 is substantially the same as the embodiment 1, and the configuration is substantially the same, except that the first conductivity type layer is a p-type layer, the second conductivity type layer is an n-type layer, and the first pad electrode and the second pad electrodes are provided to the first conductivity type layer and the second conductivity type layer, respectively.

Embodiment 2

Figure 2A:
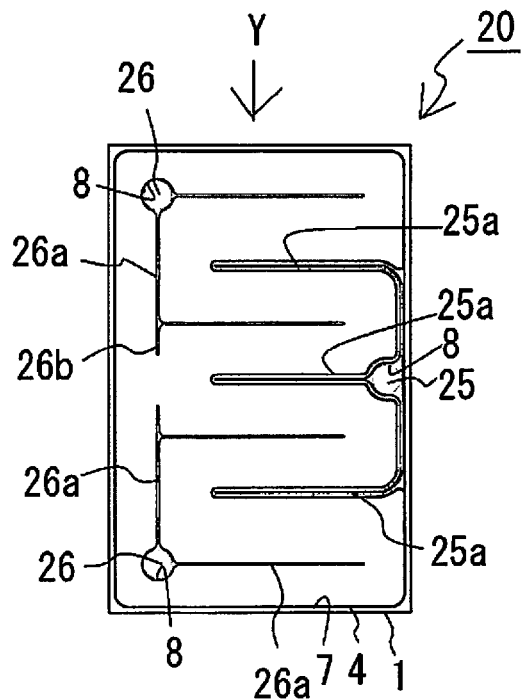
FIG. 2A is a simplified plan view of a layout of electrodes in a semiconductor light emitting element pertaining to an embodiment 2 of the present invention.

As shown in FIG. 2A, a semiconductor light emitting element 20 in Embodiment 2 is configured to be substantially same as the semiconductor light emitting element 10, except that a first pad electrode 25, first extending electrodes 25a, second pad electrodes 26, and second extending electrodes 26a have a different layout and/or shape in plan view.

In the semiconductor light emitting element 20, the first pad electrode 25 is disposed next to a long side of the light emitting element, and has the first extending electrodes 25a, which are formed in an E shape whose center is the first pad electrode 25. The first extending electrodes 25a extend from the first pad electrode 25 parallel to the lengthwise direction and in opposite directions, extend parallel to the short-side direction from the extension ends in the opposite directions, and extend parallel to the short-side direction from the first pad electrode 25.

The second pad electrodes 26 are each disposed near a short side, on the opposite side from the first pad electrode 25 with respect to the center line Y. The second extending electrodes 26a extend from the second pad electrodes 26 in the lengthwise direction and parallel to the short-side direction. The second extending electrodes 26a branch out along the extension in the lengthwise direction, one branch going in the lengthwise direction and the other in the short-side direction parallel to the first. Each of the two second extending electrodes 26a is formed in a shape close to a U shape. The second extending electrodes 26a have a part 26b that branches off from the mutually opposing second extending electrodes 26a in the middle region B. The second extending electrodes 26a extend so that the distal ends of these branching parts 26b approach each other.

The distal ends of the first extending electrodes 25a are flanked in the lengthwise direction by the second extending electrodes 26a, and part of the distal ends of the second extending electrodes 26a is flanked in the lengthwise direction by the first extending electrodes 25a. In other words, in the lengthwise direction of the semiconductor light emitting element 20, the first extending electrodes 25a and the second extending electrodes 26a are alternately disposed and substantially equidistantly spaced apart.

Modification Example 1 of Embodiment 2

Figure 2B:
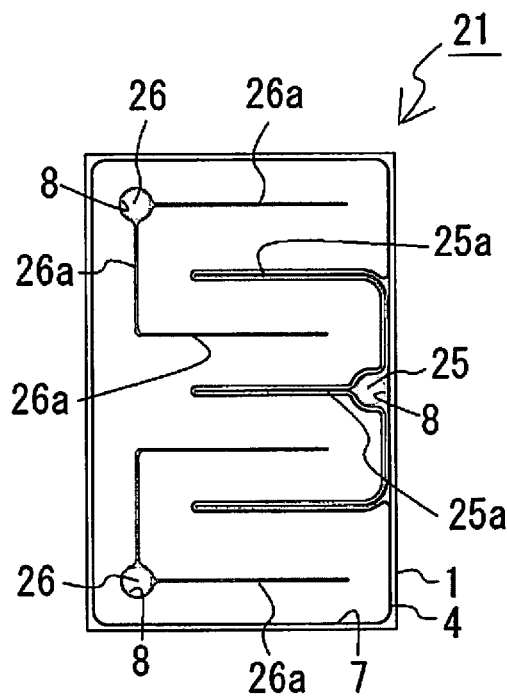
FIG. 2B is a simplified plan view of modification example of an embodiment 2 of the present invention.

As shown in FIG. 2B, in the semiconductor light emitting element 21 according to the modification example 1 of embodiment 2, the layout and/or shape of the first pad electrode 25, the first extending electrodes 25a, the second pad electrodes 26, and the second extending electrodes 26a are substantially the same as those of the semiconductor light emitting element 20, except that there are no parts 26b branching off from the mutually opposing second extending electrodes 26a. Also, the semiconductor light emitting element 21 is configured substantially the same as the semiconductor light emitting element 10.

Embodiment 3

Figure 3A:
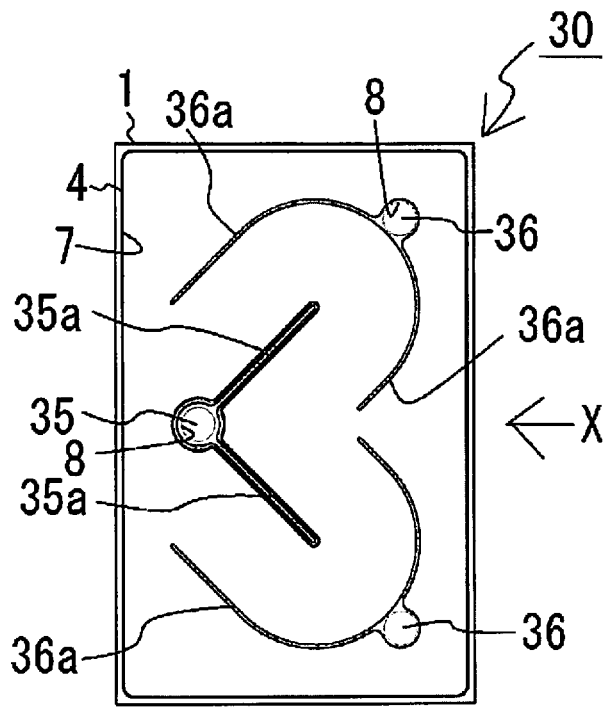
FIG. 3A is a simplified plan view of a layout of electrodes in a semiconductor light emitting element pertaining to an embodiment 3 of the present invention.

As shown in FIG. 3A, the semiconductor light emitting element 30 according to Embodiment 3 is configured substantially the same as the semiconductor light emitting element 10, except that the layout and/or shape of a first pad electrode 35, first extending electrodes 35a, second pad electrodes 36, and second extending electrodes 36a is different in plan view.

In the semiconductor light emitting element 30, the first pad electrode 35 is disposed on the center line X near a long side of the light emitting element, and has the first extending electrodes 35a. The first extending electrodes 35a, whose center is the first pad electrode 35, are symmetrical with respect to the center line X, and extend in mutually perpendicular directions.

The second pad electrodes 36 are disposed in regions near the corners of the regions A and C at both sides, and have the second extending electrodes 36a that extend so as to constitute a U shape and flank the first extending electrodes 35a.

Modification Example of Embodiment 3

Figure 3B:
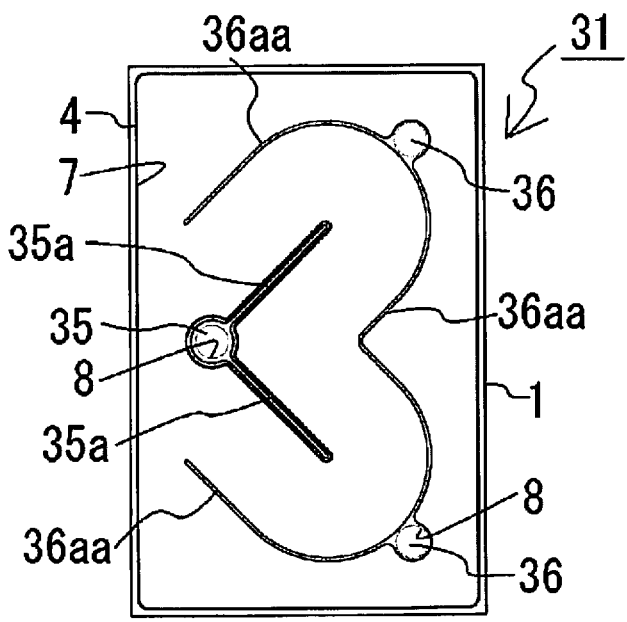
FIG. 3B is a simplified plan view of modification example of an embodiment 3 of the present invention.

As shown in FIG. 3B, the semiconductor light emitting element 31 in the modification example of embodiment 3 is configured substantially the same as the semiconductor light emitting elements 10 and 30, except that second extending electrodes 36aa extending from the second pad electrodes 36 are linked together.

Embodiment 4

Figure 4:
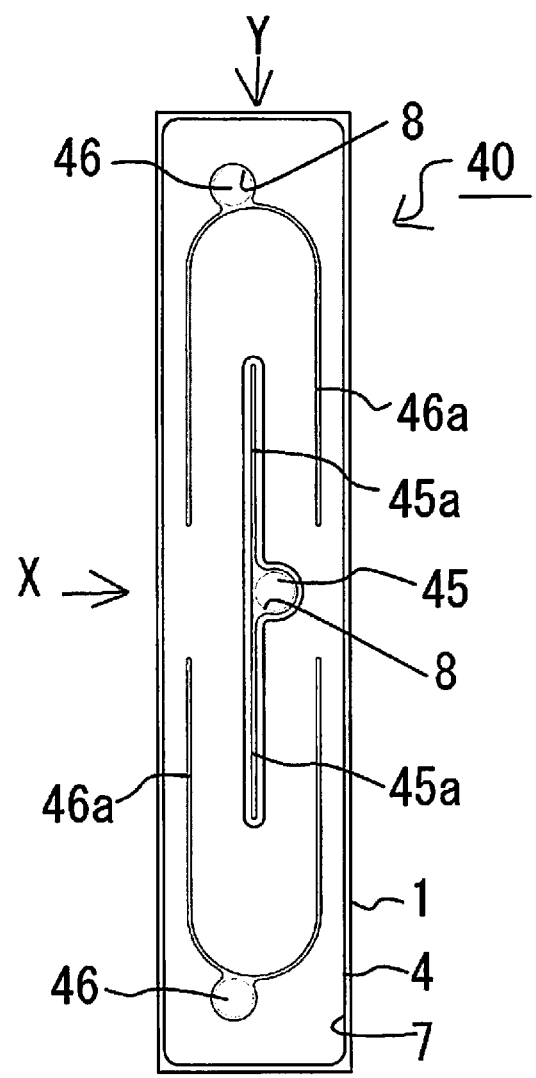
FIG. 4 is a simplified plan view of a layout of electrodes in a semiconductor light emitting element pertaining to an embodiment 4 of the present invention.

As shown in FIG. 4, the semiconductor light emitting element 40 in Embodiment 4 is configured substantially the same as the semiconductor light emitting element 10, except that the layout and/or shape of a first pad electrode 45, first extending electrodes 45a, second pad electrodes 46, and second extending electrodes 46a are different in plan view.

In the semiconductor light emitting element 40, the first pad electrode 45 is disposed on the center line X on the inside of the middle region B of the light emitting element, and has the first extending electrodes 45a. The first extending electrodes 45a extend from the first pad electrode 45 parallel to the short-side direction, branch on the center line Y, and extend in opposite directions on the center line Y, forming a sort of lid shape.

The second pad electrodes 46 are disposed in regions near the corners of the regions A and C at both sides, on a different side from that of the first pad electrode 45 with respect to the center line Y, and have the second extending electrodes 46a that extends flanking the distal ends of the first extending electrodes 45a to constitute a U shape.

Embodiment 5

As shown in FIG. 5, the semiconductor light emitting element 50 according to Embodiment 5 is configured substantially the same as the semiconductor light emitting element 10, except that one first pad electrode 55 and two second pad electrodes 56 are disposed alternately in the regions A, B, and C on the center line Y in plan view. The plan view shape, however, is a rectangle measuring 1500× 300 μm.

In the semiconductor light emitting element 50, the first pad electrode 55 is disposed on the center line X of the light emitting element, and has no extending electrode.

The second pad electrodes 56 are disposed at locations closer to the middle region B side than the centers of the regions A and C at both sides, and have no extending electrodes.

Modification Example of Embodiment 5

As shown in FIG. 5B, the semiconductor light emitting element 51 according to the modification example of Embodiment 5 is configured substantially the same as the semiconductor light emitting elements 10 and 50, except that the first pad electrode 55 is eccentrically-located closer to one long side than the center line Y, and the second pad electrodes 56 are located closer to the other long side than the center line Y.

Embodiment 6

As shown in FIG. 6A, the semiconductor light emitting element 60 in the Embodiment 6 is configured substantially the same as the semiconductor light emitting element 50 in Embodiment 5, except that second pad electrodes 66 are disposed on the center line Y and in the approximate center of the regions A and C at both sides, and that the semiconductor light emitting element 60 has second extending electrodes 66a that extend from the second pad electrodes 66 in opposite directions on the center line Y.

The length in which the second extending electrodes 66a extend to the outside is about 2 to 2.5 times the length they extend to the inside. Other structures are substantially the same as that of the semiconductor light emitting element 50.

Modification Example of Embodiment 6

As shown in FIG. 6B, the semiconductor light emitting element 61 according to Modification Example of Embodiment 6 is configured to be substantially the same as the semiconductor light emitting element 60 in Embodiment 6, except that the second pad electrodes 66 are located closer to one side in the lengthwise direction than the center line Y, that the semiconductor light emitting element 61 have the second extending electrodes 66a that extend from the second pad electrodes 66 in opposite directions on the center line Y, and that the first pad electrode 65 is located closer to the other side in the lengthwise direction than the center line Y.

Embodiment 7

Figure 7:
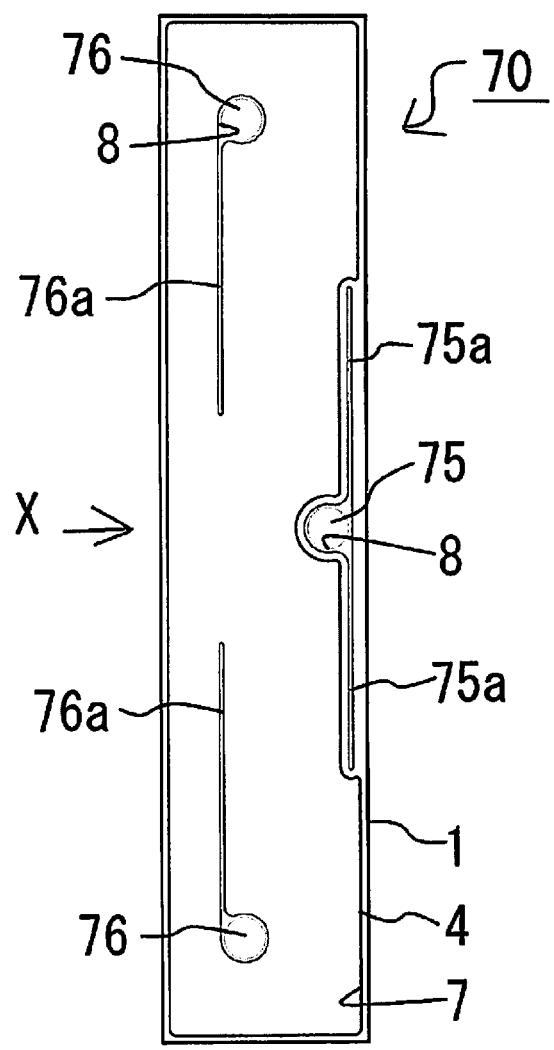
FIG. 7 is a simplified plan view of a layout of electrodes in a semiconductor light emitting element pertaining to an embodiment 7 of the present invention.

As shown in FIG. 7, in the semiconductor light emitting element 70 according to the present Embodiment 7, a first pad electrode 75 is disposed next to a long side of the light emitting element on the center line X, and has first extending electrodes 75a. The first extending electrodes 75a, whose center is the first pad electrode 75, extend parallel to the lengthwise direction in opposite directions.

Second pad electrodes 76 are disposed in regions near the corners of the regions A and C at both sides, and have second extending electrodes 76a that extend from the second pad electrodes 76 parallel to the lengthwise direction.

The first extending electrodes 75a and the second extending electrodes 76a have opposing parts disposed parallel to each other. Other structures are substantially the same as that of the semiconductor light emitting element 50.

Embodiment 8

Figure 8:
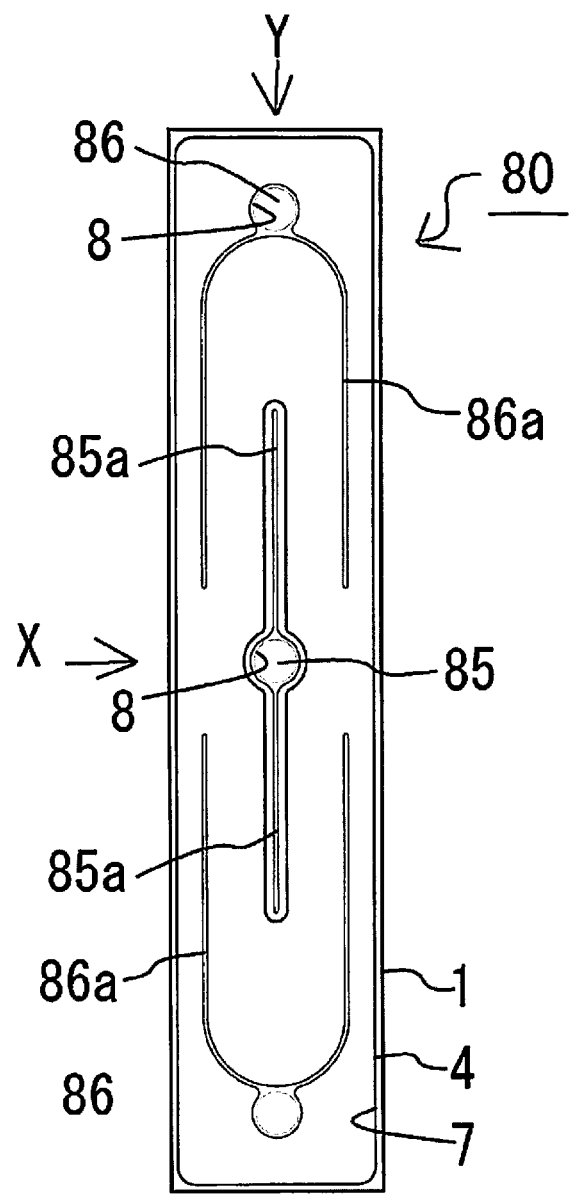
FIG. 8 is a simplified plan view of a layout of electrodes in a semiconductor light emitting element pertaining to an embodiment 8 of the present invention.

As shown in FIG. 8, the semiconductor light emitting element 80 according to Embodiment 8 is configured substantially the same as the semiconductor light emitting element 50, except that the layout and/or shape of a first pad electrode 85, first extending electrodes 85a, second pad electrodes 86, and second extending electrodes 86a is different in plan view.

In the semiconductor light emitting element 80, the first pad electrode 85 is disposed on the center line X and the center line Y, and has the first extending electrodes 85a. The first extending electrodes 85a extend from the first pad electrode 85 parallel to the lengthwise direction in opposite directions.

The second pad electrodes 86 are disposed on the center line X in the regions A and C at both sides, and have the second extending electrodes 86a. The second extending electrodes 86a extend from the second pad electrodes 86 in a U shape so as to flank the distal ends of the first extending electrodes 85a.

Evaluation of Semiconductor Light Emitting Element

Figure 9A:
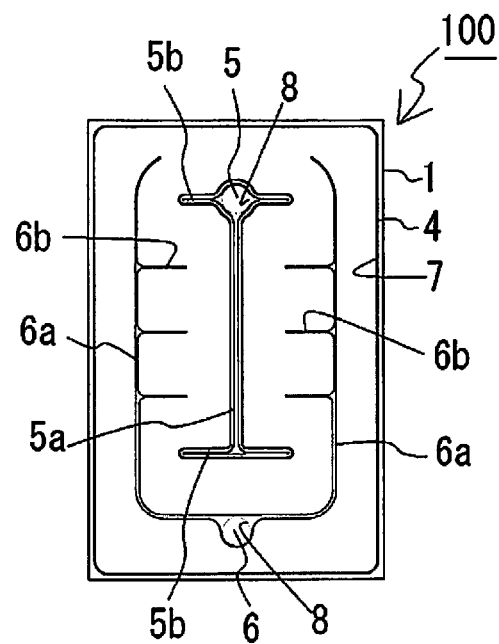
FIG. 9A is a simplified plan view of a layout of electrodes in a comparative light emitting element.

As shown in FIG. 9A, to evaluate the characteristics of the semiconductor light emitting element, a semiconductor light emitting element 100 having a conventional electrode pattern is prepared. This semiconductor light emitting element 100 has a first pad electrode 5 on the center line Y near a short side, and has a first extending electrode 5a that extends along the center line Y. It also has a second pad electrode 6 located near a short side on the opposite side from the first pad electrode 5, and has second extending electrodes 6a that extend from both sides of the second pad electrode 6 so as to constitute a U shape and to flank the first extending electrode 5a. The first extending electrode 5a and the second extending electrodes 6a each have a plurality of first extending electrodes 5b and second extending electrodes 6b that are parallel to the short sides.

Figure 9B:
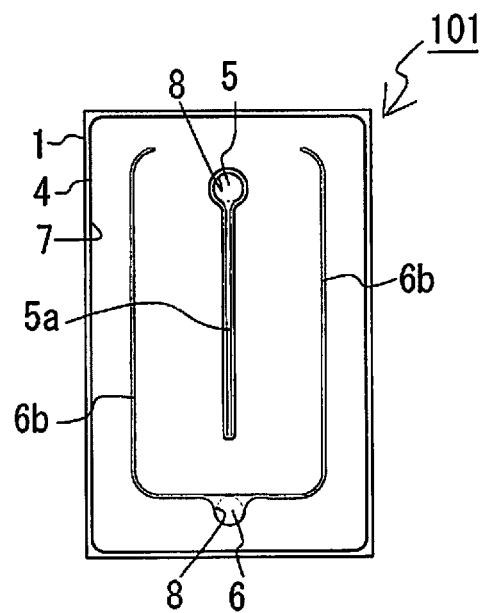
FIG. 9B is a simplified plan view of a layout of a modification example of a comparative light emitting element.

The values for light output (Po), drive (forward) voltage (Vf), and so forth are substantially the same with a semiconductor light emitting element 101, which has substantially the same configuration and is shown in FIG. 9B, except that it does not have the first extending electrodes 5b and the second extending electrodes 6b which are parallel to the short sides.

Evaluation of Light Output (Po) and Drive (Forward) Voltage (Vf)

Figure 10A:
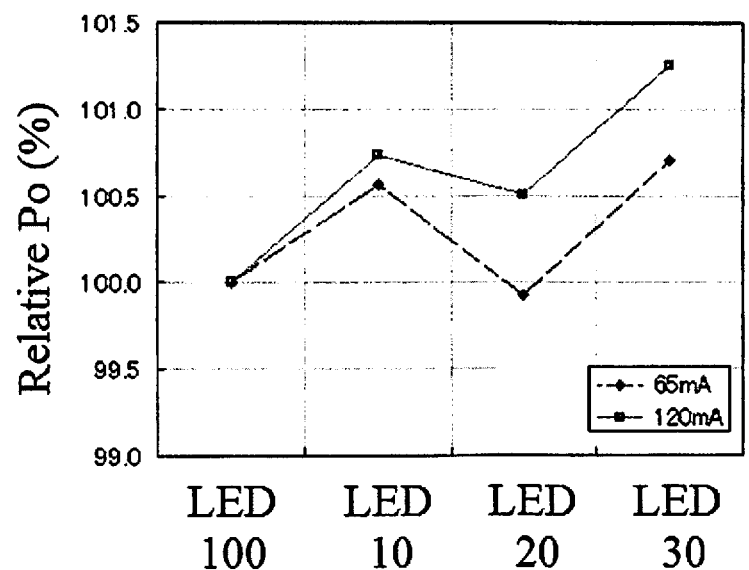
FIG. 10A is a graph of a light output ($P_o$) of a semiconductor light emitting element pertaining to an embodiment of the present invention.
Figure 10B:
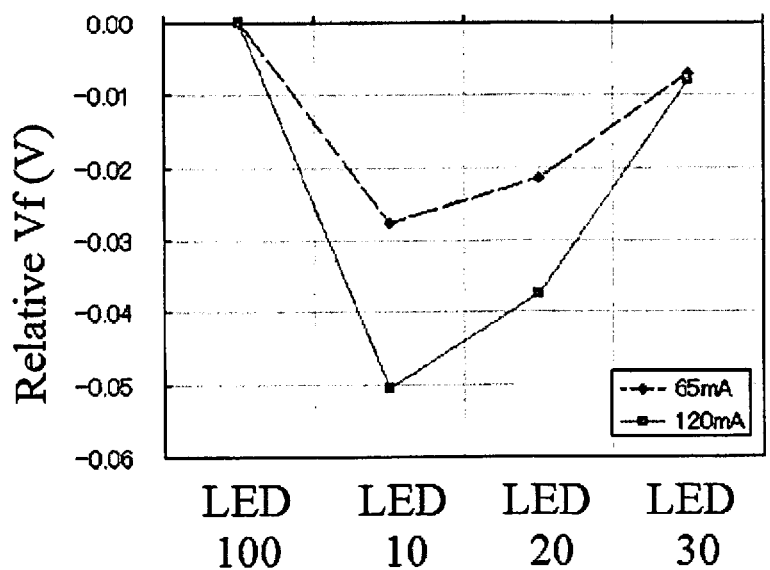
FIG. 10B is a graph of a drive (forward) voltage ($V_f$) of a semiconductor light emitting element pertaining to an embodiment of the present invention.

The light output (Po) and drive (forward) voltage (Vf) are measured at currents of 65 mA and 120 mA for the semiconductor light emitting elements 10, 20, and 30, versus the above-mentioned semiconductor light emitting element 100. The results are given in FIGS. 10A and 10B as relative values based on the semiconductor light emitting element 100.

It is confirmed from these results that the light emitting elements 10, 20, and 30 of these embodiments exhibited light output (Po) that is as good as or better than that of the light emitting element 100. It is also confirmed that this characteristic is more pronounced the larger is the applied current.

This result is attributable to that the length (surface area) is reduced in the first extending electrodes and second extending electrodes, and the shape thereof is simplified, so that the reduction in light output (Po) due to blockage by the electrodes is minimized. In particular, the light emitting element 30 has higher light output (Po) because the overall length of the electrode extensions is shortest.

Also, despite the simplified layout, the drive (forward) voltage (Vf) is increased by achieving the proper current distribution. In particular, with the light emitting element 10, it is confirmed that a uniform current density is achieved over the entire semiconductor layer, without any excess current flowing between the first pad electrode, the first extending electrodes, the second pad electrodes, and the second extending electrodes, which results in better light output (Po) and drive (forward) voltage (Vf).

Evaluation of Power Efficiency

The power efficiency is calculated as {light output/(current×voltage)}×100(%), and the proportional improvement with respect to that reference is compared ((target/reference)×100−100(%). The result is shown in FIG. 10C. In an evaluation using the light emitting element 100 in FIG. 10C as a reference, it is confirmed that the power efficiency increased from 0.5 to 1.8% with the light emitting elements 10, 20, and 30 according to the embodiments.

The semiconductor light emitting element according to the embodiments of the present invention can be suitably employed for various lighting apparatuses, in particular, a light source for lighting, an LED display, backlight source for a liquid crystal display, signals, a lighted switch, various sensors, various indicators, an auxiliary light source for moving image, other consumer light sources, or the like.

What is claimed is:

1. A semiconductor light emitting element comprising;
    a first conductivity type layer, a light emitting layer, and a second conductivity type layer that are laminated,
    a first pad electrode disposed on the first conductivity type layer so as to be electrically connected to the first conductivity type layer, the first pad electrode having first extending electrodes including four distal ends, and
    second pad electrodes disposed on the second conductivity type layer so as to be electrically connected to the second conductivity type layer, the second pad electrodes having second extending electrodes that surround the four distal ends of the first extending electrodes,
    plan view shape of the semiconductor light emitting element being rectangular,
    the first pad electrode being disposed in a middle region of three regions of the semiconductor light emitting element in plan view, the three regions defined by dividing the light emitting element into three equal parts in a lengthwise direction of the semiconductor light emitting element,
    the second pad electrodes being disposed in regions on both sides of the middle region respectively, and
    the first pad electrode and the second pad electrodes being disposed on the same side of the semiconductor light emitting element.

2. The semiconductor light emitting element according to claim 1, wherein
    the second pad electrodes are disposed in symmetry with respect to a center line extending in a short-side direction of the semiconductor light emitting element.

3. The semiconductor light emitting element according to claim 1, wherein
    the first pad electrode is disposed on a center line extending in a short-side direction of the semiconductor light emitting element.

4. The semiconductor light emitting element according to claim 1, wherein
    the first extending electrodes extend to the regions on both sides of the middle region.

5. The semiconductor light emitting element according to claim 4, wherein
    the second extending electrodes extend so as to flank the distal ends of the first extending electrodes.

6. The semiconductor light emitting element according to claim 4, wherein
    the first extending electrodes have the distal ends that are opposite the second extending electrodes in the regions on both sides of the middle region.

7. The semiconductor light emitting element according to claim 5, wherein
    the second extending electrodes are respectively disposed closer to sides of the semiconductor light emitting element in the lengthwise direction than the first extending electrodes in plan view.

8. The semiconductor light emitting element according to claim 4, wherein
    the second pad electrodes are respectively disposed closer to sides of the semiconductor light emitting element in the lengthwise direction than the first extending electrodes in plan view.

9. The semiconductor light emitting element according to claim 1, wherein
    the first pad electrode is disposed on a different side from the second pad electrodes with respect to a center line extending in the lengthwise direction of the semiconductor light emitting element.

10. The semiconductor light emitting element according to claim 1, wherein
    the second pad electrodes are disposed so as to separate from one another in the regions on both sides of the middle region, respectively.

11. The semiconductor light emitting element according to claim 1, wherein
    a size of a light emitting face of the semiconductor light emitting element is at least 0.45 mm$^2$.

12. The semiconductor light emitting element according to claim 1, wherein each of the first pad electrode and the second pad electrodes has a maximum length of about 10 to 20% of a length of a short side of the semiconductor light emitting element.

13. The semiconductor light emitting element according to claim 1, wherein
the first pad electrode is surrounded by the second conductivity type layer and the light emitting layer.

14. The semiconductor light emitting element according to claim 1, wherein
the second extending electrodes are separated away from one another at the middle region.

15. The semiconductor light emitting element according to claim 1, wherein
the second pad electrodes are disposed on the second conductivity type layer with a light-transmissive electrically-conducting layer being disposed between the second conductivity type layer and the second pad electrodes.

\* \* \* \* \*